(12) United States Patent
Kim et al.

(10) Patent No.: US 8,815,731 B2
(45) Date of Patent: Aug. 26, 2014

(54) SEMICONDUCTOR PACKAGE AND METHOD OF FABRICATING THE SAME

(75) Inventors: Young Lyong Kim, Anyang-si (KR); Hyeongseob Kim, Cheonan-si (KR); Jongho Lee, Hwaseong-si (KR); Eunchul Ahn, Yongin-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 169 days.

(21) Appl. No.: 13/174,959

(22) Filed: Jul. 1, 2011

(65) Prior Publication Data
US 2012/0001329 A1    Jan. 5, 2012

(30) Foreign Application Priority Data
Jul. 1, 2010   (KR) .................. 10-2010-0063538

(51) Int. Cl.
*H01L 21/44*  (2006.01)
*H01L 23/00*  (2006.01)
*H01L 23/31*  (2006.01)
*H01L 23/498* (2006.01)

(52) U.S. Cl.
CPC ......... *H01L 24/14* (2013.01); *H01L 2224/0401* (2013.01); *H01L 2924/15311* (2013.01); *H01L 2924/014* (2013.01); *H01L 24/73* (2013.01); *H01L 2224/11848* (2013.01); *H01L 24/11* (2013.01); *H01L 23/3128* (2013.01); *H01L 2224/13022* (2013.01); *H01L 2224/16227* (2013.01); *H01L 2924/3511* (2013.01); *H01L 24/16* (2013.01); *H01L 2924/1434* (2013.01); *H01L 2224/17179* (2013.01); *H01L 2224/14517* (2013.01); *H01L 2224/73204* (2013.01); *H01L 24/17* (2013.01); *H01L 2224/13147* (2013.01); *H01L 2924/01006* (2013.01); *H01L 24/13* (2013.01); *H01L 23/49811* (2013.01); *H01L 2224/81385* (2013.01); *H01L 2224/81191* (2013.01); *H01L 2224/116* (2013.01); *H01L 2224/1403* (2013.01); *H01L 2224/14051* (2013.01); *H01L 2924/01033* (2013.01); *H01L 2224/131* (2013.01); *H01L 2224/05567* (2013.01); *H01L 2224/17051* (2013.01); *H01L 24/81* (2013.01); *H01L 2924/01029* (2013.01); *H01L 2224/13082* (2013.01)
USPC ........... 438/613; 438/611; 438/612; 438/614; 438/618; 438/619; 438/760; 438/772; 257/737; 257/738; 257/E21.508; 257/E21.511

(58) Field of Classification Search
CPC .......................... H01L 24/81; H01L 23/49811
USPC ................. 438/611–614, 618–619, 760, 772; 257/737, E21.508, E21.511
See application file for complete search history.

(56) References Cited

U.S. PATENT DOCUMENTS 7,045,900 B2 * 5/2006 Hikita et al. .................. 257/777
7,109,583 B2 * 9/2006 Johnson ........................ 257/734

(Continued)

FOREIGN PATENT DOCUMENTS

JP   10-256712   9/1998
KR   10-2005-0045628 A   5/2005

(Continued)

*Primary Examiner* — David Vu
*Assistant Examiner* — Brandon Fox
(74) *Attorney, Agent, or Firm* — Stanzione & Kim, LLP

(57) ABSTRACT

A semiconductor package and a method for fabricating the same. The semiconductor package includes a first substrate including a first pad, a second substrate spaced apart from the first substrate and where a second pad is formed to face the first pad, a first bump electrically connecting the first pad to the second pad, and a second bump mechanically connecting the first substrate to the second substrate is disposed between the first substrate where the first pad is not formed and the second substrate where the second pad is not formed. A coefficient of thermal expansion (CTE) of the second bump is smaller than that of the first bump.

18 Claims, 7 Drawing Sheets

(56) References Cited

U.S. PATENT DOCUMENTS

| | | | |
|---|---|---|---|
| 7,361,990 B2 * | 4/2008 | Lu et al. | 257/738 |
| 8,164,186 B2 * | 4/2012 | Watanabe et al. | 257/735 |
| 8,178,392 B2 * | 5/2012 | Choi et al. | 438/108 |
| 2003/0143971 A1 * | 7/2003 | Hongo et al. | 455/313 |
| 2009/0166857 A1 * | 7/2009 | Lee | 257/737 |
| 2009/0246474 A1 * | 10/2009 | Sakurai et al. | 428/172 |

FOREIGN PATENT DOCUMENTS

| | | |
|---|---|---|
| KR | 10-200500118694 A | 12/2005 |
| KR | 10-2009-0070589 A | 7/2009 |

* cited by examiner

SEMICONDUCTOR PACKAGE AND METHOD OF FABRICATING THE SAME

CROSS-REFERENCE TO RELATED APPLICATIONS

This U.S. non-provisional patent application claims priority under 35 U.S.C. §119(a) to Korean Patent Application No. 10-2010-0063538, filed on Jul. 1, 2010, in the Korean Intellectual Property Office, the entirety of which is hereby incorporated by reference.

BACKGROUND OF THE INVENTION

1. Field of the Invention

The present general inventive concept relates semiconductor packages and methods of fabricating the same and, more particularly, to a flip chip package and a method of fabricating the same.

2. Description of the Related Art

A flip chip package is a type of semiconductor chip package. A flip chip package includes a semiconductor chip and a printed circuit board (PCB) that are disposed to face each other. Pads of the semiconductor chip and pads of the PCB are electrically connected in one-to-one correspondence by a conductive pump. As a distance between a semiconductor chip and a PCB becomes shorter and shorter, a conductive bump continues to decrease in size. The decreased size of the conductive bump results in formation of voids and seams in a filler material that fills a space between the semiconductor chip and the PCB.

SUMMARY OF THE INVENTION

Exemplary embodiments of the present general inventive concept can provide a semiconductor package. The semiconductor package may include a first substrate including a first pad, a second substrate spaced apart from the first substrate and where a second pad is formed to face the first pad, a first bump disposed to electrically connect the first pad to the second pad, and a second bump disposed between the first substrate and the second substrate. A coefficient of thermal expansion (CTE) of the second bump may be smaller (e.g., substantially smaller) than that of the first bump.

Additional features and utilities of the present general inventive concept will be set forth in part in the description which follows and, in part, will be obvious from the description, or may be learned by practice of the general inventive concept.

In exemplary embodiments of the present general inventive concept, the second bump may connect to a first edge of the first substrate to a second edge of the second substrate.

According to exemplary embodiments of the present general inventive concept, the second bump may mechanically connect a first portion of the first substrate where the first pad is not formed to a second portion of a second substrate where the second pad is not formed.

According to exemplary embodiments of the present general inventive concept, the first bump may include a first conductive pattern formed adjacent to the first pad and a second conductive pattern having one side in contact with the first conductive pattern and another side in contact with the second conductive pattern.

According to exemplary embodiments of the present general inventive concept, the first conductive pattern may include copper (Cu) and the second conductive pattern may include a solder ball.

According to exemplary embodiments of the present general inventive concept, the second bump may include a third conductive pattern that is in contact with the first substrate and a fourth conductive pattern having one side is in contact with the third conductive pattern and another side in contact with the second substrate.

According to exemplary embodiments of the present general inventive concept, the third conductive pattern may include copper (Cu) and the fourth conductive pattern may include a solder ball.

According to exemplary embodiments of the present general inventive concept, the second substrate may include a first opening exposing the second pad and a second opening partially exposing the second substrate. A portion of the first bump may be buried in the first opening, and a portion of the second bump may be buried in the second opening.

According to exemplary embodiments of the present general inventive concept, the semiconductor package may further include a filler material filling a space between the first substrate and the second substrate.

According to exemplary embodiments of the present general inventive concept, the filler material may include an epoxy resin and a filler.

Exemplary embodiments of the present general inventive concept may also provide a method of fabricating a semiconductor package. The method may include forming a first pad at one side of a first substrate, forming a first bump to be electrically connected to the first pad, forming a second bump at one face of the first substrate where the first pad is not formed, forming a second pad at one face of a second substrate, electrically connecting the first bump to the second pad, and mechanically connecting the second bump to the one face of the second substrate where the second pad is not formed. A coefficient of thermal expansion (CTE) of the second bump may be smaller (e.g., substantially smaller) than that of the first bump.

According to exemplary embodiments of the present general inventive concept, the forming of the first bump may include partially etching the first substrate to expose the first pad, forming a first conductive pattern to be electrically connected to the first pad, and forming a second conductive pattern on the first conductive pattern to be electrically connected to the first conductive pattern.

According to exemplary embodiments of the present general inventive concept, the forming of the second bump may include forming a third conductive pattern on the second substrate and forming a fourth conductive pattern on the third conductive pattern.

According to exemplary embodiments of the present general inventive concept, the third conductive pattern may be formed together with the first conductive pattern, and the fourth conductive pattern may be formed together with the second conductive pattern.

According to exemplary embodiments of the present general inventive concept, the electrically connecting of the first bump to the second pad may include partially etching the second substrate such that a first opening is formed to expose the second pad, inserting the first bump into the first opening, and electrically connecting the first bump to the second bump.

According to exemplary embodiments of the present general inventive concept, the connecting of the second bump to the second substrate may include partially etching the second substrate to form a second opening, inserting the second bump into the second opening, and connecting the second bump to the second substrate.

According to exemplary embodiments of the present general inventive concept, the first opening may be together with the second opening. The first bump and the second bump may be inserted into the first opening and the second opening.

Exemplary embodiments of the present general inventive concept may also provide a semiconductor package including a first substrate, a second substrate spaced apart from the first substrate, a first bump disposed to electrically connect a first pad of the first substrate to a second pad of the second substrate, and a second bump to mechanically connect a first edge of the first substrate to a second edge of the second substrate, where a coefficient of thermal expansion (CTE) of the second bump is smaller than that of the first bump.

The second substrate of the semiconductor package can include a first opening to expose the second pad of the second substrate, and a second opening to at least partially expose the second substrate.

The semiconductor package can include where the second bump mechanically connects the at least partially exposed second substrate with a portion of the first substrate that is spaced apart from the first pad.

The semiconductor package can include where the first substrate includes an insulating layer, and a recess in the insulating layer to at least partially expose the first pad.

Exemplary embodiments of the present general inventive concept may also include an electronic apparatus including a memory card having a memory controller communicatively coupled to a memory device, the memory card including a first substrate, a second substrate spaced apart from the first substrate, a first bump disposed to electrically connect a first pad of the first substrate to a second pad of the second substrate, a second bump to mechanically connect a first edge of the first substrate to a second edge of the second substrate, where a coefficient of thermal expansion (CTE) of the second bump is smaller than that of the first bump, and where the memory controller and the memory device are disposed on at least one of the first substrate and the second substrate.

Exemplary embodiments of the present general inventive concept may also include an electronic apparatus, including an information processing system including a processor communicatively coupled to a memory system having a memory controller and a memory device, the information processing system including a first substrate, a second substrate spaced apart from the first substrate, a first bump disposed to electrically connect a first pad of the first substrate to a second pad of the second substrate, and a second bump to mechanically connect a first edge of the first substrate to a second edge of the second substrate, where a coefficient of thermal expansion (CTE) of the second bump is smaller than that of the first bump, and where the information processing system including the processor and the memory system are disposed on at least one of the first substrate and the second substrate.

BRIEF DESCRIPTION OF THE DRAWINGS

The inventive concept will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the inventive concept. The features and/or utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1A:
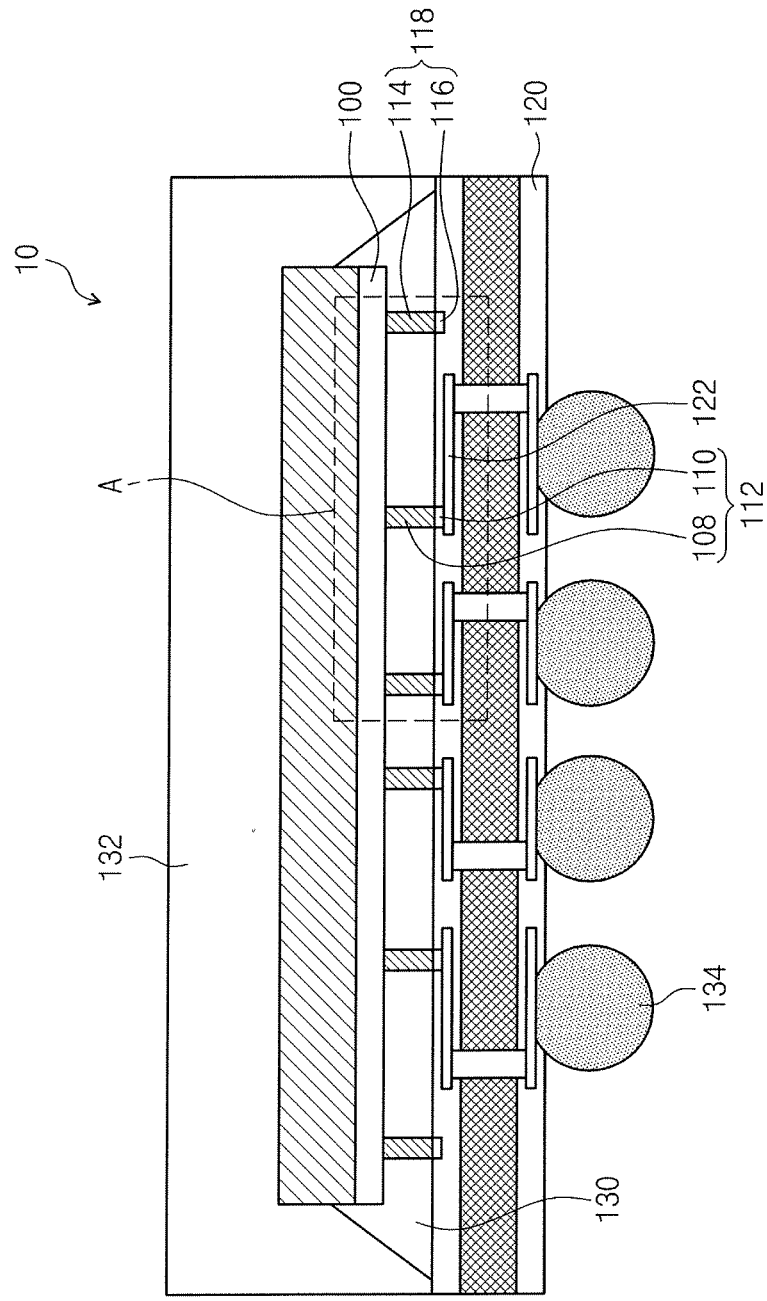
FIG. 1A is a cross-sectional view illustrating a semiconductor package according to exemplary embodiments of the present general inventive concept.

The utilities and features of the present general inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept.

In the specification, it will be understood that when an element is referred to as being "on" another layer or substrate, it can be directly on the other element, or intervening elements may also be present. In the drawings, thicknesses of elements are exaggerated for clarity of illustration.

Exemplary embodiments of the present general inventive concept will be described below with reference to cross-sectional views, which are exemplary drawings of the invention. The exemplary drawings may be modified by manufacturing techniques and/or tolerances. Accordingly, the exemplary embodiments of the present general inventive concept are not limited to specific configurations illustrated in the drawings, and include modifications based on the method of manufacturing the semiconductor device. For example, an etched region shown at a right angle may be formed in a rounded shape or formed to have a predetermined curvature. Therefore, regions shown in the drawings have schematic characteristics. In addition, the shapes of the regions shown in the drawings exemplify specific shapes of regions in an element, and do not limit the invention. Though terms like a first, a second, and a third are used to describe various elements in various embodiments of the inventive concept, the elements are not limited to these terms. These terms are used only to tell one element from another element. An embodiment described and exemplified herein includes a complementary embodiment thereof.

The terms used in the specification are for the purpose of describing particular embodiments only and are not intended to be limiting of the invention. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof.

The present general inventive concept will now be described more fully hereinafter with reference to the accompanying drawings, in which exemplary embodiments of the present general inventive concept are illustrated.

Figure 1B:
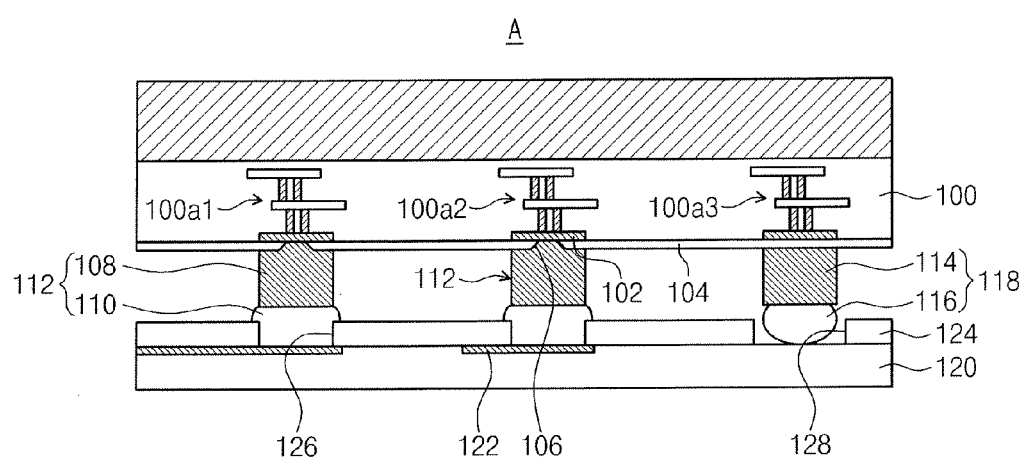
FIG. 1B is an enlarged cross-sectional view of a portion 'A' of the semiconductor package illustrated in FIG. 1A.

FIG. 1A is a cross-sectional view illustrating a semiconductor package 10 according to exemplary embodiments of the present general inventive concept, and FIG. 1B is an enlarged cross-sectional view of a portion 'A' of the semiconductor package illustrated in FIG. 1A.

Referring to FIGS. 1A and 1B, the semiconductor package 10 may include a first substrate 100, circuitry 100a1, circuitry 100a2, circuitry 100a3, a first pad 102, a second substrate 120, a second pad 122, a first bump 112, a second bump 118, a first filler material 130, and a second filler material 132.

The first substrate 100 may include at least one of the circuitry 100a1, 100a2, and/or 100a3, where each may be a semiconductor chip or semiconductor package. The semiconductor chip and/or semiconductor package may include a memory chip or a non-memory chip.

The first pad 102 may be electrically connected to a semiconductor chip. The first pad 102 may be provided at the first substrate 100 and formed adjacent to one face of the first substrate 100. As an example, the first pad 102 may be formed on a surface of the one face of the first substrate 100. An insulating layer 104 may be provided to at least partially cover both sides of the first pad 102. A recess 106 may be formed at the insulating layer 104 to at least partially expose the first pad 102. As another example, the first pad 102 may be formed on one face (e.g., inside one face) of the first substrate 100. The first pad 102 may be exposed to the outside by partially etching an upper portion of the first substrate 100.

The first pad 102 may include a conductive material, e.g., metal.

According to exemplary embodiments of the present general inventive concept, a first pad 102 may be formed at one face of the first substrate 100. A metal layer may be formed at another face that is opposite to the one face of the substrate 100. The metal layer may dissipate heat of a semiconductor package (e.g., semiconductor package 10 illustrated in FIG. 1). The metal layer may not be electrically connected to a semiconductor chip of the first substrate 100 and the first pad 102.

The second substrate 120 may be a printed circuit board (PCB). One face of the second substrate 120 may be opposite to the one face of the first substrate 100 and may be spaced apart therefrom.

The second pad 122 may be provided at the second substrate 120 and formed adjacent to one face of the second substrate 120. As an example, the second pad 122 may be formed on a surface of the one face of the second substrate 120. An insulating pattern 124 having a first opening 126 formed to expose the second pad 122 may be provided on the one face of the second substrate 120 where the second pad 122 is formed.

A second opening 128 may be formed at the insulating pattern 124 to at least partially expose the second substrate 120. Depth and width of the second opening 128 may be equal to (e.g., substantially equal to) those of the first opening 126. The second opening 128 may be a portion of the second substrate 120 where the second pad 122 is not formed. For example, the second opening 128 may be formed on the edge of the second substrate 120.

The first bump 112 may electrically connect the first pad 102 and the second pad 122 to each other. The first bump 112 may include a first conductive pattern 108 and a second conductive pattern 110.

More specifically, one side of the first conductive pattern 108 may be in contact with the first pad 102, another of the first conductive pattern 108 may be in contact with one side of the second conductive pattern 110, and another side of the second conductive pattern 110 may be in contact with the second pad 122. The another side of the second conductive pattern 110 may be inserted into the first opening 126 to be in contact with the second pad 122. The first conductive pattern 108 may include a metal such as copper (Cu) or a metal compound. The second conductive pattern 110 may include a solder ball.

The second bump 118 may mechanically connect the first substrate 100 and the second substrate 120 to each other. The second bump 118 may include a third conductive pattern 114 and a fourth conductive pattern 116.

More specifically, one side of the third conductive pattern 114 may be in contact with the first substrate 100 where the first pad 102 is not formed, another side of the third conductive pattern 114 may be in contact with one side of the fourth conductive pattern 116, and another of the fourth conductive pattern 116 may be in contact with the second substrate 120 where the second pad 122 is not formed. The other side of the fourth conductive pattern 116 may be inserted into the second opening 128 to be in contact with the second substrate 120. The third conductive pattern 114 may include a metal such as copper (Cu) or a metal compound. The fourth conductive pattern 116 may include a solder ball.

The third conductive pattern 114 may be identical in shape and material with the first conductive pattern 108. The fourth pattern 116 may be identical in shape and material with the second conductive pattern 110. The third conductive pattern 114 may be larger than (e.g., substantially larger than) the first conductive pattern 108. The fourth conductive pattern 116 may be larger than (e.g., substantially larger than) the second conductive pattern 110.

According to exemplary embodiments of the present general inventive concept, the second bump 118 mechanically connecting the first substrate 100 to the second substrate 120 may have a lower surface thermal expansion coefficient than the first bump 112 electrically connecting the first pad 102 to the second pad 122.

The first filler material 130 may be provided to fill a space between the first substrate 100 and the second substrate 120. A first bump 112 and a second bump 118 may be provided at the space between the first substrate 100 and the second substrate 120. A space between the first bump 112 and the second bump 118 may be filled with the first filler material 130.

According to exemplary embodiments of the present general inventive concept, the first filler material 130 may include an epoxy resin and a filler. The filler material may have a size ranging from about 3 micrometers to about 25 micrometers, and the content of the filler in the epoxy resin may be about 70 to 99 percent by weight.

The second filler material 132 may seal the first substrate 100 and the second substrate 120 thereon. The second filler material 132 may include the same (e.g., substantially the same) material as the first filler material 130.

The semiconductor package 10 may include an external terminal 134 electrically connected to the second substrate 120. More specifically, the external terminal 134 may be electrically connected to the other face of the second substrate 120. The external terminal 134 may be, for example, a solder ball.

A warpage phenomenon of the first substrate 100 can occur as the first substrate 100 increases in size. According to exemplary embodiments of the present general inventive concept, the second bump 118 may mechanically connect the edges of the first substrate 100 and the second substrate 120 to each other to suppress the warpage phenomenon. The second bump 118 may not be electrically connected to a metal such as the first pad 102 or the second pad 122 to suppress a metal wetting phenomenon. Thus, the height of the second bump 118 may be minimized and/or prevented from decreasing so as to suppress formation of voids or seams in the first filler material 130 that fills the space between the first and second substrates 100 and 120. When the first and second substrates 100 and 120 have different thermal expansion coefficients, the second bump 118 may not receive the stress caused by the different thermal expansion coefficient so as to minimize and/or be invulnerable to the damage caused by an external impact.

FIGS. 2A to 2D are cross-sectional views illustrating a method of fabricating a semiconductor package according to an embodiment of the inventive concept.

Figure 2A:
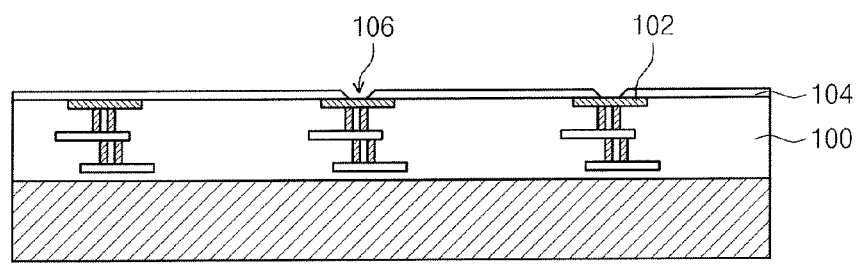
FIGS. 2A to 2D are cross-sectional views illustrating a method of fabricating a semiconductor package according to exemplary embodiments of the present general inventive concept.

Referring to FIG. 2A, a semiconductor chip (not illustrated) and a first pad 102 may be formed on a first semiconductor substrate 100.

The first substrate 100 may include a semiconductor substrate such as a silicon (Si) substrate, a germanium (Ge) substrate, a silicon-germanium (Si—Ge) substrate or a silicon-on-insulator (SOI) substrate, a germanium-on-insulator (GOI) substrate, a silicon-germanium-on-insulator (SGOI) substrate, and the like.

The first pad 102 may be formed at one face of the first substrate 100. According to exemplary embodiments of the present general inventive concept, the first pad 102 may be formed at one face of the first substrate 100. When the first pad 102 is formed, an insulating layer 104 may be formed on the one face of the first substrate 100 with a recess 106 which exposes the first pad 102 while at least partially covering both sides of the first pad 102. According to exemplary embodiments of the present general inventive concept, a plurality of first pads 102 may be formed. Among the first pads 102, a first pad 102 formed on the edge of the first substrate 100 may be covered (e.g., entirely covered) with the insulating layer 104.

A metal layer may be formed on another face which is opposite to the one face of the substrate 100. The metal layer may not be electrically connected to the semiconductor chip and the first pad 102 of the first substrate 100. The metal layer may dissipate heat of the first substrate 100.

Figure 2B:
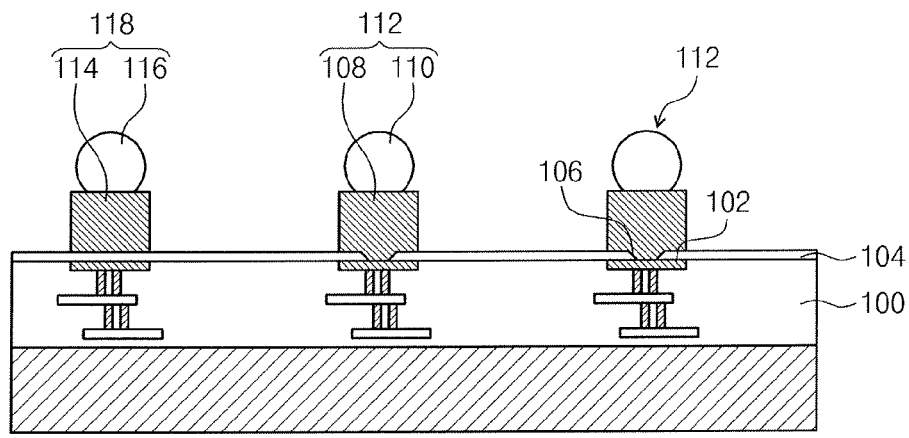

Referring to FIG. 2B, a first bump 112 and a second bump 118 may be formed on the first substrate 100.

The first bump 112 may be formed to be electrically connected to the first pad 102 while filling the recess 106 of the insulating layer 104. The first bump 112 may include a first conductive pattern 108 and a second conductive pattern 110 that are stacked in the order named (i.e., the second conductive pattern may be stacked on the first conductive pattern 108).

The second bump 118 may be formed on an insulating pattern 124 that covers (e.g., entirely covers) the first pad 102. The second bump 118 may include a third conductive pattern 114 and a fourth conductive pattern 116 that are stacked in the order named (e.g., the fourth conductive patter 116 may be stacked on the third conductive pattern 114).

A method of forming the first bump 112 and the second bump 118 will now be described more fully. A first conductive pattern 108 and a second conductive pattern 110 may be formed on the first pad 102 exposed by the recess 106 and the insulating layer 104 entirely covering the first pad 102, respectively. The first conductive pad 108 and a third conductive pad 114 may include a metal such as copper (Cu) or a metal compound. As an example, the first conductive pattern 108 and the third conductive pattern 114 may be formed by patterning a conductive layer after forming the conductive layer. As another example, the first conductive pattern 108 and the third conductive pattern 114 may be formed by a damascene process that includes forming a sacrificial pattern, forming a first conductive pattern 108 and the third conductive pattern 114, and removing the sacrificial pattern.

The second conductive pattern 110 and a fourth conductive pattern 116 may be formed on the first conductive pattern 108 and the third conductive pattern 114, respectively. When each of the second and fourth conductive patterns 110 and 116 is a solder ball, a solder ball can be formed on each of the first and third conductive patterns 108 and 114. By heating the solder balls, the second conductive pattern 110 may be joined onto the first conductive pattern 108 to form a first bump 112 and, at the same time, the fourth pattern 116 may be joined onto the third conductive pattern 114 to form a second bump 118.

According to exemplary embodiments of the present general inventive concept, the first bump 112 and the second bump 118 may be the same (e.g., substantially identical) in shape and size. According to exemplary embodiments of the inventive concept, the first bump 112 and the second bump 118 may be different (e.g., substantially different) in shape and size. For example, the size of the second bump 118 may be larger than (e.g., substantially larger than) that of the first bump 112.

Figure 2C:
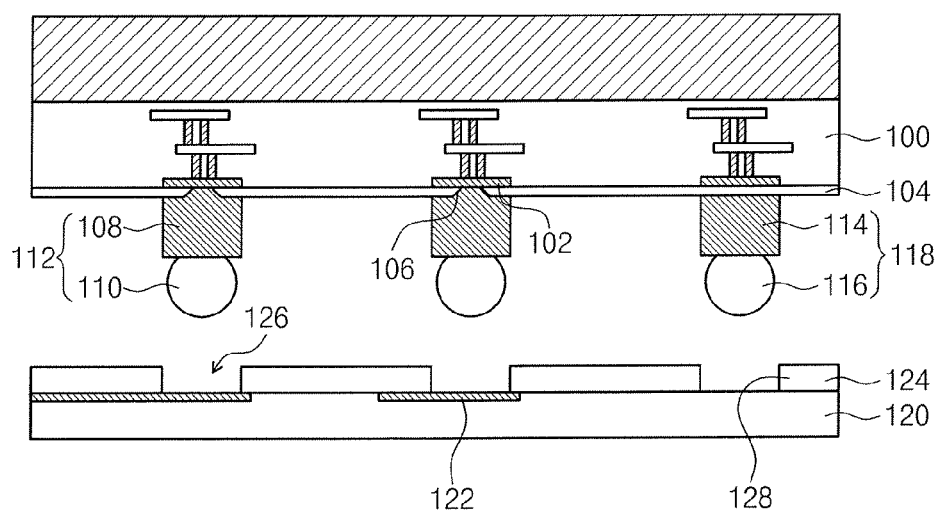

Referring to FIG. 2C, a second substrate 120 where a second pad 122 is formed may be prepared.

More specifically, a second pad 122 may be formed at one face of a second substrate 120. An insulating pattern 124 having a first opening 126 exposing the second pad 122 and a second opening 127 partially exposing the second substrate 120 may be formed on the second substrate 120 where the second pad 122 is formed.

According to exemplary embodiments of the present general inventive concept, the first opening 126 and the second opening 128 may be the same width (e.g., substantially identical in width). According to exemplary embodiments of the present general inventive concept, the first opening 126 and the second opening 128 may be different in width (e.g., substantially different in width). For example, the width of the second opening 128 may be greater than (e.g., substantially greater than) that of the first opening 126.

The first substrate 100 and the second substrate 120 may be positioned such that the second pad 122 and the first pad 102 face each other. The first bump 112 and the second bump 118 may be disposed to correspond to the first opening 126 and the second opening 128, respectively.

Figure 2D:
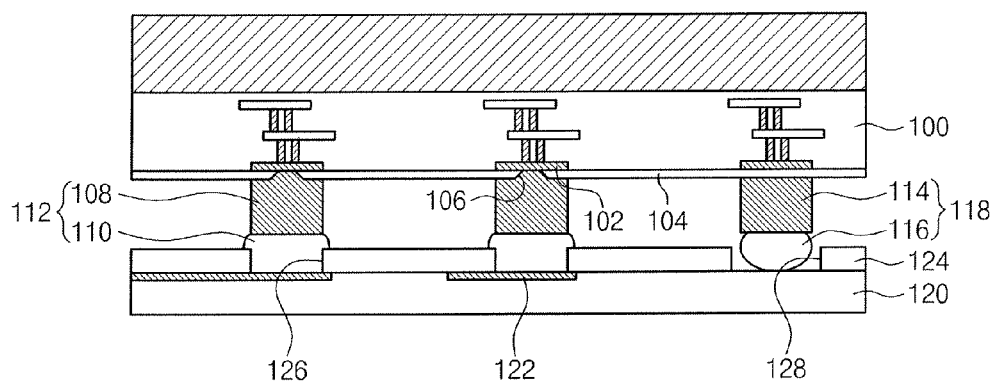

Referring to FIG. 2D, the first bump 112 and the second bump 118 may contact the second pad 122 and the second substrate 120, respectively.

The first pad 112 may be electrically connected to the second pad 122. More specifically, the other side of the second conductive pattern 110 of the first bump 112 may be in contact with a top surface of the second pad 122 through the first opening 126.

The second bump 118 may be electrically connected to the second substrate 120. More specifically, the other side of the fourth conductive pattern 116 of the second bump 118 may contact a top surface of the second substrate through the second opening 128.

According to exemplary embodiments of the present general inventive concept, the second bump 118 mechanically connecting the first substrate 100 to the second substrate 120 may have a smaller surface thermal expansion coefficient than the first bump 112 electrically connecting the first pad 102 to the second pad 122. Thus, any stress on the second bump 118 from a difference in thermal expansion coefficient between the first substrate 100 and the second substrate 120 may be reduced. The second bump may be invulnerable to an external impact and/or may minimize the external impact.

Returning to FIG. 1A, the first filler material 130 may fill a space between the first substrate 100 and the second substrate 120 where the first bump 112 and the second bump 118 are formed. The second bump 118 may be formed on the edges of the first substrate 100 and the second substrate 120 to mechanically the first substrate 100 to the second substrate 120. Thus, a space between the first substrate 100 and the second substrate 120 may be sufficiently secured by the first second bump 118 to suppress formation of voids or seams in the first filler material 130.

The second filler material 132 may be formed on the first substrate 100 and the second substrate 120 to seal the first substrate 100 and the second substrate 120. An external terminal 134 may be formed at the other end of the second substrate 120 to be electrically connected to the second substrate 120. The external terminal 134 may be a solder ball.

Figure 3A:
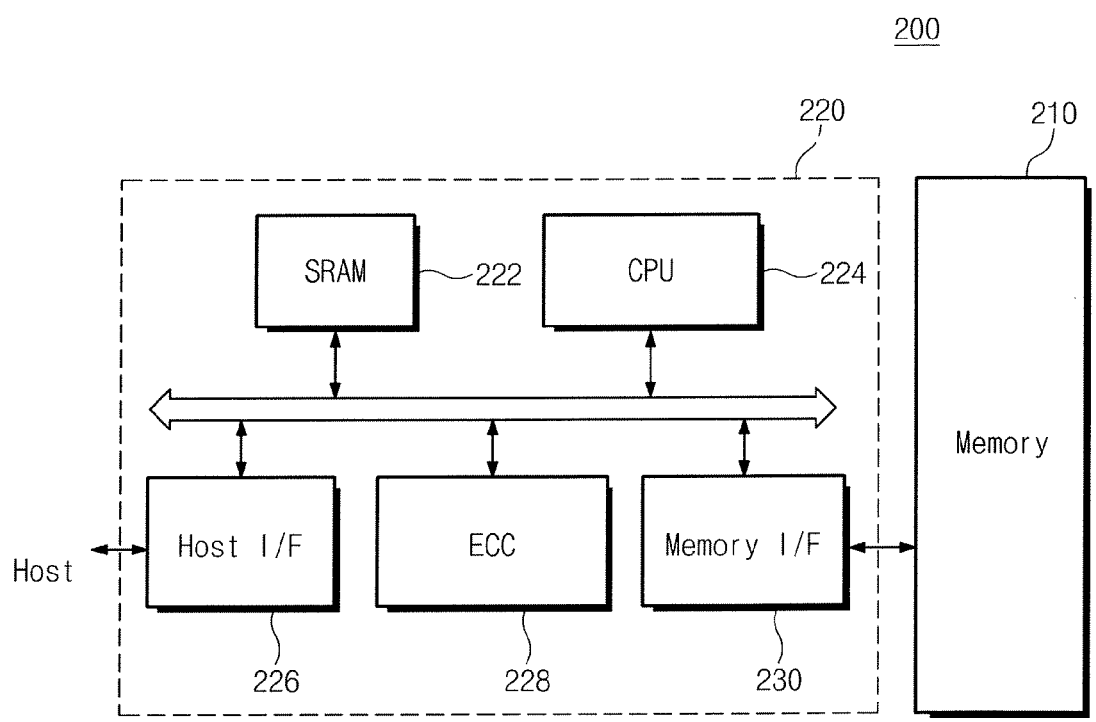
FIG. 3A is a block diagram illustrating a memory card including a variable resistance memory device according to exemplary embodiments of the present general inventive concept.

FIG. 3A is a block diagram illustrating a memory card 200 including a variable resistance memory device according to exemplary embodiments of the present general inventive concept.

Referring to FIG. 3A, a semiconductor package according to exemplary embodiments of the present general inventive concept may be applied to the memory card 200. As an example, the memory card 200 may include a memory controller 220 controlling overall data exchange between a host and a memory 210. A static random access memory (SRAM) 222 may be a working memory of a central processing unit (CPU) 224. A host interface 226 may exchange data with a host connected to the memory card 200 with one or more data exchange protocols. An error correction code circuit (ECC) 228 may detect and correct an error that may be included in data read from a resistive memory 210. A memory interface 230 may interface with the resistive memory 210 so as to exchange data between the memory controller 220 and the resistive memory 210. The central processing unit (CPU) 224 can control one or more operations of data exchange between the memory controller 220 and the host and/or the resistive memory 210. The CPU 224 may be a controller, an integrated circuit, a field programmable gate array, a programmable logic device, an application specific integrated circuit, or any suitable processor to carry out the exemplary embodiments of the present general inventive concept disclosed herein. Although not illustrated in the drawings, the memory card 200 may include a read only memory or "ROM" (not illustrated) that stores code data, that when executed (e.g., by the CPU 224) to interface with the host.

The semiconductor memory 210 applied to the memory card 200 can include a semiconductor package fabricated according to exemplary embodiments of the present general inventive concept described herein to minimize and/or prevent a defect caused by generation of voids or seam in a filler material.

Figure 3B:
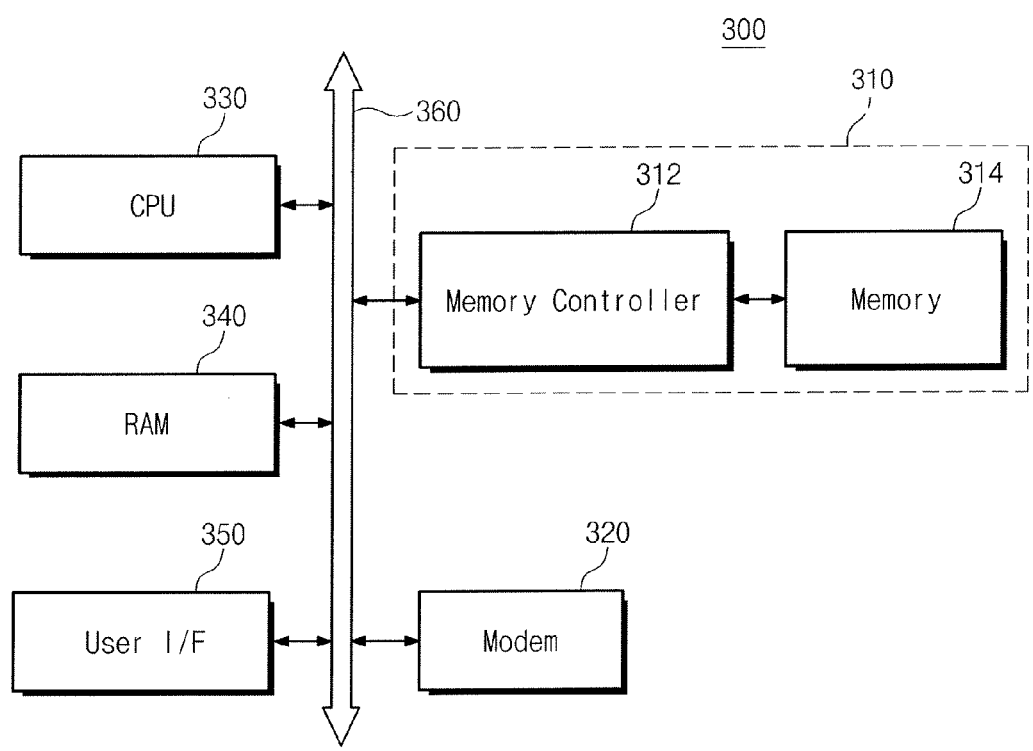
FIG. 3B is a block diagram illustrating an information processing system to which a variable resistance memory device according to exemplary embodiments of the present general inventive concept is applied.

FIG. 3B is a block diagram illustrating an information processing system 300 to which a variable resistance memory device according to exemplary embodiments of the present general inventive concept is applied.

Referring to FIG. 3B, the information processing system 300 may include a memory system 310 including a semiconductor package according to exemplary embodiments of the present general inventive concept. The information processing system 300 may include a mobile device or a computer. The information processing system 300 may be a personal computer, a laptop computer, a server, a tablet computer, a cell phone, a digital media player, a set top box, any/or any other suitable device. As an example, the information processing system 300 may include a memory system 310 and a modem 320 which are electrically connected to a system bus 360, a central processing unit (CPU) 330, a random access memory (RAM) 340, and a user interface 350. The CPU 330 may be a controller, a programmable logic device, a field programmable gate array, and/or any suitable processor. The user interface 350 may include, for example, one or more of a keypad, a keyboard, a touch-sensitive display, or a mouse. Data processed by the CPU 330 or externally input data may be stored in the memory system 310. The memory system 310 may include a memory 312 and a memory controller 314 and may be organized with the same structure as the memory card 200 described with reference to FIG. 3A. The information processing system 300 may be provided in the form of a memory card, a solid state disk, a camera image sensor and other application chipset. In one example, the flash memory system 310 may be a semiconductor disk device (SSD). In this case, the information processing system 300 may stably and reliably store high-capacity data in the memory system 310.

Figure 4:
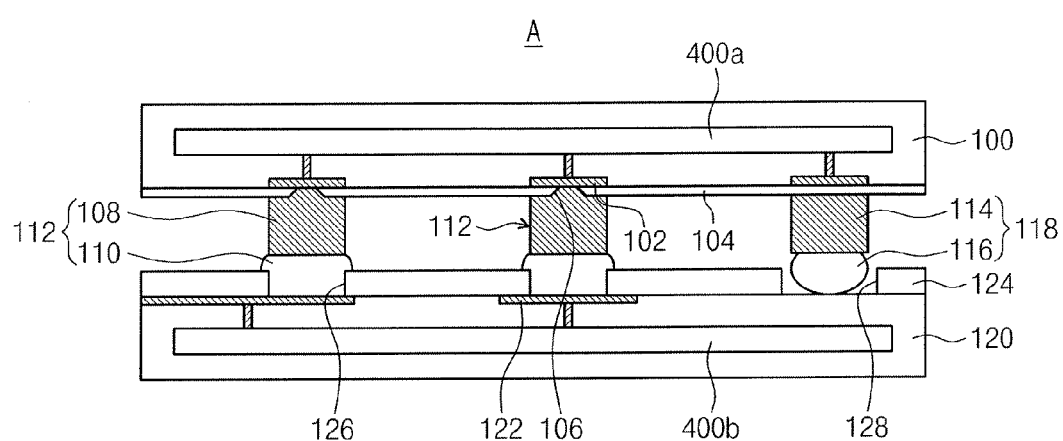
FIG. 4 is a cross-sectional view illustrating a semiconductor package including one or more internal circuits according to exemplary embodiments of the present general inventive concept.

FIG. 4 is a cross-sectional view illustrating a semiconductor package including one or more internal circuits according to exemplary embodiments of the present general inventive concept. FIG. 4A illustrates an alternative of portion 'A' of FIGS. 1A-1B, and can include the first substrate 100, the first pad 102, the recess 106, the second substrate 120, the insulating pattern 124, the first opening 126, the second opening 128, the first bump 112, and the second bump 118 as described in detail above. The first bump 112 can include the first conductive pattern 108 and the second conductive pattern 110, and the second bump 118 can include the third conductive pattern 114 and the fourth conductive pattern 116, as described in detail above. Internal circuits 400a and 400b may include one or more semiconductor chips that may be a processor, a controller, and/or a memory. Internal circuit 400a may be communicatively coupled to the first pad 102, and the internal circuit 400b may be communicatively coupled to the second pad 122. Although internal circuits 400a and 400b are illustrated in FIG. 4, exemplary embodiments of the present general inventive concept may include one of internal circuits 400a and 400b. The second bump 118 may have a first portion having the same shape as the first bump 112, and a second portion having a different shape from the first bump 112. The second bump 118 may be disposed so as to be spaced apart from the adjacent first bump 112 by a distance. The first bumps 112 may be spaced apart from each other by the distance. However, the distance may vary between the two adjacent first bumps 112 or between the first bump 112 and the second bump 118.

According to exemplary embodiments of the inventive concept described above, balance of the centers and the edges of a first substrate and a second substrate can be maintained by second bumps disposed on the edges of the first substrate and the second substrate. The second bump may not electrically connect a first pad and a second pad to each other, but may mechanically connect the first substrate and the second substrate to each other. Thus, a warpage phenomenon between conductive layers may be minimized and/or suppressed to prevent height of the second bump from decreasing. Generation of voids or seams in a filler material filling a space between the first substrate and the second substrate may be minimized and/or suppressed without decrease in height of the second bump. Moreover, the second bump may not receive a stress caused by a difference in thermal expansion coefficient between the first substrate and the second substrate. As a result, the second bump can be invulnerable to and/or may minimize the damage caused by an external impact.

While the present general inventive concept has been described with reference to exemplary embodiments, it will be apparent to those skilled in the art that various changes and modifications may be made without departing from the spirit and scope of the present general inventive concept. Therefore, it should be understood that the above embodiments are not limiting, but illustrative. Thus, the scope of the present general inventive concept is to be determined by the broadest permissible interpretation of the following claims and their equivalents, and shall not be restricted or limited by the foregoing description.

What is claimed is:

1. A semiconductor package comprising:
a first substrate including a first pad;
a second substrate having a coefficient of thermal expansion(CTE) different from a coefficient of thermal expansion of the first substrate, spaced apart from the first substrate and where a second pad is formed to face the first pad;
a first bump disposed to electrically connect the first pad to the second pad; and
a second bump disposed between the first substrate and the second substrate,
wherein a height of the first bump is larger than a height of the second bump, and
wherein the second substrate includes a first opening to expose the second pad and a second opening to at least partially expose the second substrate, and the second opening is filled with a fourth conductive pattern and a filler material.

2. The semiconductor package as set forth in claim 1, wherein the second bump connects a first edge of the first substrate to a second edge of the second substrate.

3. The semiconductor package as set forth in claim 1, wherein the second bump mechanically connects a first portion of the first substrate where the first pad is not formed to a second portion of the second substrate where the second pad is not formed.

4. The semiconductor package as set forth in claim 1, wherein the first bump includes:
a first conductive pattern formed adjacent to the first pad; and
a second conductive pattern having one side in contact with the first conductive pattern and another side in contact with the second pad.

5. The semiconductor package as set forth in claim 4, wherein the first conductive pattern includes copper (Cu) and the second conductive pattern includes a solder ball.

6. The semiconductor package as set forth in claim 4, wherein the second bump includes:
a third conductive pattern that is in contact with the first substrate; and
the fourth conductive pattern having one side in contact with the third conductive pattern and another side in contact with the second substrate.

7. The semiconductor package as set forth in claim 6, wherein the third conductive pattern includes copper (Cu) and the fourth conductive pattern includes a solder ball.

8. The semiconductor package as set forth in claim 6, wherein a height of the first conductive pattern is larger than a height of the third conductive pattern.

9. The semiconductor package as set forth in claim 1, wherein the filler material fills a space between the first substrate and the second substrate, and the filler material includes an epoxy resin and a filler.

10. The semiconductor package as set forth in claim 9, wherein the second substrate includes a first opening to expose the second pad and a second opening to at least partially expose the second substrate, and
wherein the second opening is filled with the second bump and the filler material.

11. A method of fabricating a semiconductor package, comprising:
forming a first pad at one side of a first substrate;
forming a first bump to be electrically connected to the first pad;
forming a second bump at one face of the first substrate where the first pad is not formed;
forming a second pad at one face of a second substrate having a coefficient of thermal expansion (CTE) different from a coefficient of thermal expansion of the first substrate;
electrically connecting the first bump to the second pad; and
mechanically connecting the second bump to the one face of the second substrate where the second pad is not formed,
wherein a height of the first bump is larger than a height of the second bump, and
wherein the second substrate includes a first opening to expose the second pad and a second opening to at least partially expose the second substrate, and the second opening is filled with a fourth conductive pattern and a filler material.

12. The method as set forth in claim 11, wherein the third conductive pattern is formed together with the first conductive pattern, and
the fourth conductive pattern is formed together with the second conductive pattern.

13. The method as set forth in claim 11, wherein the electrically connecting of the first bump to the second pad includes:
partially etching the second substrate such that a first opening is formed to expose the second pad;
inserting the first bump into the first opening; and
electrically connecting the first bump to the second bump.

14. The method as set forth in claim 13, wherein the connecting of the second bump to the second substrate includes:
partially etching the second substrate to form a second opening;
inserting the second bump into the second opening; and
connecting the second bump to the second substrate.

15. The method as set forth in claim 14, wherein the first opening is together with the second opening, and
the first bump is inserted into the first opening, and the second bump is inserted into the second opening.

16. A semiconductor package comprising:
a first substrate;
a second substrate having a coefficient of thermal expansion (CTE) different from a coefficient of thermal expansion of the first substrate, spaced apart from the first substrate;

a first bump disposed to electrically connect a first pad of the first substrate to a second pad of the second substrate, including a first conductive pattern and a second conductive pattern stacked; and a second bump to mechanically connect a first edge of the first substrate to a second edge of the second substrate, including a first conductive pattern and a second conductive pattern stacked, wherein a height of the first bump is larger than a height of the second bump, wherein the second substrate includes a first opening to expose the second pad and a second opening to at least partially expose the second substrate, and the second opening is filled with a fourth conductive pattern and a filler material.

17. The semiconductor package of claim 16, wherein the second bump mechanically connects the at least partially exposed second substrate with a portion of the first substrate that is spaced apart from the first pad.

18. The semiconductor package of claim 16, wherein the first substrate includes an insulating layer, and a recess in the insulating layer to at least partially expose the first pad.

* * * * *